(12) United States Patent
Rudmann et al.

(10) Patent No.: US 10,180,235 B2
(45) Date of Patent: Jan. 15, 2019

(54) OPTICAL MODULE, IN PARTICULAR OPTO-ELECTRONIC MODULE, AND METHOD OF MANUFACTURING THE SAME

(71) Applicant: Heptagon Micro Optics Pte. Ltd., Singapore (SG)

(72) Inventors: Hartmut Rudmann, Jona (CH); Markus Rossi, Jona (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 685 days.

(21) Appl. No.: 14/413,887

(22) PCT Filed: Jul. 9, 2013

(86) PCT No.: PCT/SG2013/000285
§ 371 (c)(1),
(2) Date: Jan. 9, 2015

(87) PCT Pub. No.: WO2014/014413
PCT Pub. Date: Jan. 23, 2014

(65) Prior Publication Data
US 2015/0204511 A1     Jul. 23, 2015

Related U.S. Application Data

(60) Provisional application No. 61/672,626, filed on Jul. 17, 2012.

(51) Int. Cl.
*F21V 1/00*        (2006.01)
*F21V 7/00*        (2006.01)
(Continued)

(52) U.S. Cl.
CPC ............ *F21V 7/0033* (2013.01); *F21V 13/02* (2013.01); *G01J 1/0271* (2013.01); *G01J 1/0407* (2013.01);
(Continued)

(58) Field of Classification Search
CPC ...... F21V 13/02; F21V 7/0033; G01J 1/0271; G01J 1/0407; G02B 17/023;
(Continued)

(56) References Cited

U.S. PATENT DOCUMENTS 5,170,269 A * 12/1992 Lin .......................... G02B 5/32
                                                              359/20
5,191,204 A * 3/1993 Dickson ................. G11B 7/127
                                                             250/208.2
(Continued)

OTHER PUBLICATIONS

International Search Report issued in PCT/SG2013/000285 (undated).

*Primary Examiner* — Tsion Tumebo
(74) *Attorney, Agent, or Firm* — Fish & Richardson P.C.

(57) ABSTRACT

The optical module (1) comprises—a first member (O) having a first face (F1) which is substantially planar;—a second member (P) having a second face (F2) facing the first face (F1), which is substantially planar and is aligned substantially parallel to the first face;—a third member (S) comprised in the first member (O) or comprised in the second member (P) or distinct from and located between these, which comprises an opening (4);—a mirror element (31'; 31''') present on the second face (F2); and—an active optical component (26) present on the second face (F2) and electrically connected to the second member (P); wherein at least one of the first and second members comprises one or more transparent portions (t) through which light can pass. The method for manufacturing the optical module (1) comprises the steps of a) providing a first wafer; b) providing a second wafer on which the mirror elements (31'. . . ) are present; c) providing a third wafer, wherein the third wafer is comprised in the first wafer or is comprised in the second wafer or is distinct from these, and wherein the third wafer comprises openings (4); e) forming a wafer stack comprising these wafers; wherein at least one of the first wafer and the
(Continued)

second wafer comprises transparent portions (t) through which light can pass.

17 Claims, 7 Drawing Sheets

(51) Int. Cl.

| | |
|---|---|
| G02B 7/00 | (2006.01) |
| G02B 7/02 | (2006.01) |
| G02B 17/02 | (2006.01) |
| G02B 27/42 | (2006.01) |
| H01L 31/0232 | (2014.01) |
| H01L 27/146 | (2006.01) |
| F21V 13/02 | (2006.01) |
| G01J 1/02 | (2006.01) |
| G01J 1/04 | (2006.01) |
| G02B 7/182 | (2006.01) |
| G01J 3/02 | (2006.01) |
| G01J 3/18 | (2006.01) |
| G02B 5/10 | (2006.01) |

(52) U.S. Cl.
CPC ........... *G01J 3/0205* (2013.01); *G01J 3/0256* (2013.01); *G01J 3/0262* (2013.01); *G01J 3/0264* (2013.01); *G01J 3/0291* (2013.01); *G01J 3/1804* (2013.01); *G02B 7/003* (2013.01); *G02B 7/021* (2013.01); *G02B 7/182* (2013.01); *G02B 17/023* (2013.01); *G02B 27/4244* (2013.01); *H01L 27/14601* (2013.01); *H01L 31/02325* (2013.01); *G02B 5/10* (2013.01); *Y10T 29/49826* (2015.01)

(58) Field of Classification Search
CPC ...... G02B 27/4244; G02B 5/10; G02B 7/003; G02B 7/021; G02B 7/182; H01L 27/14601; H01L 31/02325; Y10T 29/49826
USPC ........................................................ 362/235
See application file for complete search history.

(56) References Cited

U.S. PATENT DOCUMENTS

| | | | | |
|---|---|---|---|---|
| 5,214,535 | A * | 5/1993 | Harris | G02B 5/1876 264/1.6 |
| 5,912,872 | A | 6/1999 | Feldman et al. | |
| 6,235,141 | B1 * | 5/2001 | Feldman | G02B 6/4206 156/250 |
| 6,314,223 | B1 | 11/2001 | Te Kolste et al. | |
| 6,669,803 | B1 * | 12/2003 | Kathman | G02B 6/12 156/250 |
| 7,148,502 | B2 * | 12/2006 | Yamazaki | H01L 51/5016 257/40 |
| 7,208,771 | B2 * | 4/2007 | Kathman | G02B 6/4201 156/250 |
| 8,045,159 | B2 | 10/2011 | Egloff et al. | |
| 9,671,576 | B1 * | 6/2017 | Tong | G02B 6/422 |
| 2002/0141062 | A1 | 10/2002 | Christoffersen et al. | |
| 2004/0104460 | A1 * | 6/2004 | Stark | B81B 7/0067 257/678 |
| 2004/0264884 | A1 * | 12/2004 | Liu | G02B 6/42 385/89 |
| 2006/0030074 | A1 * | 2/2006 | Mund | B81C 1/00269 438/108 |
| 2006/0227845 | A1 * | 10/2006 | Degertekin | G01D 5/285 372/102 |
| 2007/0009223 | A1 * | 1/2007 | Rudmann | H01L 25/167 385/147 |
| 2008/0136955 | A1 * | 6/2008 | Kathman | G02B 6/4231 348/340 |
| 2009/0230493 | A1 * | 9/2009 | Watanabe | H01L 23/544 257/433 |
| 2010/0165621 | A1 * | 7/2010 | Hoffend, Jr. | G02B 6/0031 362/235 |
| 2011/0050979 | A1 * | 3/2011 | Rudmann | H01L 27/14623 348/335 |
| 2011/0188054 | A1 * | 8/2011 | Petronius | B23P 11/00 356/610 |
| 2011/0220278 | A1 * | 9/2011 | Rudmann | B29D 11/00278 156/250 |
| 2012/0032216 | A1 * | 2/2012 | Dong | H01L 33/58 257/98 |
| 2012/0063131 | A1 * | 3/2012 | Jamar | G03F 7/70391 362/235 |
| 2013/0177274 | A1 * | 7/2013 | Kosenko | G02B 6/3628 385/14 |

\* cited by examiner

OPTICAL MODULE, IN PARTICULAR OPTO-ELECTRONIC MODULE, AND METHOD OF MANUFACTURING THE SAME

TECHNICAL FIELD

The invention relates to the field of optics and more specifically to the packaging and manufacturing of optical or opto-electronic components. More particularly, it relates to optical modules as well as to appliances and devices comprising such modules, and to methods of manufacturing these. The invention relates to methods and apparatuses according to the opening clauses of the claims.

Definition of Terms

"Active optical component": A light sensing or a light emitting component. E.g., a photodiode, an image sensor, an LED, an OLED, a laser chip. An active optical component can be present as a bare die or in a package, i.e. as a packaged component.

"Passive optical component": An optical component redirecting light by refraction and/or diffraction and/or (internal and/or external) reflection such as a lens, a prism, a mirror, or an optical system, wherein an optical system is a collection of such optical components possibly also comprising mechanical elements such as aperture stops, image screens, holders.

"Opto-electronic module": A component in which at least one active and at least one passive optical component is comprised.

"Replication": A technique by means of which a given structure or a negative thereof is reproduced. E.g., etching, embossing, imprinting, casting, molding.

"Wafer": A substantially disk- or plate-like shaped item, its extension in one direction (z-direction or vertical direction) is small with respect to its extension in the other two directions (x- and y-directions or lateral directions). Usually, on a (non-blank) wafer, a plurality of like structures or items are arranged or provided therein, typically on a rectangular grid. A wafer may have openings or holes, and a wafer may even be free of material in a predominant portion of its lateral area. A wafer may have any lateral shape, wherein round shapes and rectangular shapes are very common. Although in many contexts, a wafer is understood to be prevailingly made of a semiconductor material, in the present patent application, this is explicitly not a limitation. Accordingly, a wafer may prevailingly be made of, e.g., a semiconductor material, a polymer material, a composite material comprising metals and polymers or polymers and glass materials. In particular, hardenable materials such as thermally or UV-curable polymers are interesting wafer materials in conjunction with the presented invention.

"Lateral": cf. "Wafer"

"Vertical": cf. "Wafer"

"Light": Most generally electromagnetic radiation; more particularly electromagnetic radiation of the infrared, visible or ultraviolet portion of the electromagnetic spectrum.

BACKGROUND OF THE INVENTION

In U.S. Pat. No. 5,912,872, an integrated optical apparatus is presented. In the manufacture thereof, a support wafer having a plurality of active elements thereon is aligned with a transparent wafer having a corresponding plurality of optical elements. Such a support-transparent wafer pair may then be diced apart.

In US 2011/0050979 A1, an optical module for an electro-optical device with a functional element is disclosed. The optical module includes a lens substrate portion with at least one lens element, and a spacer. The spacer serves to keep the lens substrate at a well-defined axial distance from a base substrate portion of the fully assembled electro-optical device. In order to ensure an improved performance of the functional element, an EMC shield is provided. The spacer is at least in parts electrically conductive and thus forms the EMC shield or a part thereof. A method of manufacturing a plurality of such modules on a wafer scale is also disclosed in US 2011/0050979 A1.

From U.S. Pat. No. 6,314,223 B1, a laser power monitor and system is known. Therein, a laser emits light through a substrate on which a diffractive element is present, the diffractive element reflecting a portion of the emitted laser light to a photodetector.

SUMMARY OF THE INVENTION

It is one object of the invention to create an novel way of manufacturing optical modules or devices and/or to create novel optical modules or devices. In addition, appliances comprising a multitude of such optical modules or devices shall be provided. And furthermore, specific wafers and methods for manufacturing these shall be provided.

Another object of the invention is to provide particularly miniscule or compact or miniaturized optical modules or devices and/or to provide methods for manufacturing the same.

Another object of the invention is to provide a particularly fast way of manufacturing optical modules or devices.

Another object of the invention is to provide optical modules or device having particularly low manufacturing tolerances and a way of manufacturing such optical modules or devices with high precision.

Another object of the invention is to provide a way of mass-producing miniaturized optical modules or devices and to provide corresponding optical modules or devices.

Another object of the invention is to provide optical modules allowing to realize elaborate light paths inside the optical module.

Another object of the invention is to provide optical modules which are composed of a particularly low number of parts.

The optical modules and/or devices can in particular be opto-electronic modules.

Further objects emerge from the description and embodiments below.

At least one of these objects is at least partially achieved by apparatuses and methods according to the patent claims.

The optical module comprises
- a first member having a first face which is substantially planar, wherein directions perpendicular to said first face are referred to as vertical directions;
- a second member having a second face facing said first face, which is substantially planar and is aligned substantially parallel to said first face;
- a third member comprised in said first member or comprised in said second member or distinct from and located between these, which comprises an opening;
- a mirror element present on said second face; and
- an active optical component present on said second face and electrically connected to said second member;

wherein at least one of said first and second members comprises one or more transparent portions through which light can pass.

Directions perpendicular to a vertical direction will be referred to as lateral directions.

It can in particular be provided that said mirror element is or comprises a diffraction grating, but usually, the mirror element is a non-diffractive reflecting element. Typically, said mirror element is based merely on specular reflection. Said mirror element can in particular be an optical mirror. Said mirror element usually has an optical quality reflective surface typically having a reflectivity of at least 90%, usually of at least 98%. The mirror element may in general be flat or curved. A curved mirror can combine reflectivity (also present in case of flat mirrors) with focussing/defocussing functions. It is even possible to provide a mirror element of flexible shape (instead of a stable shape), e.g., a reflective membrane.

Usually, said mirror element is a member separate from said active optical component. But it is possible to provide that they are equal, e.g., when an electrically driven micromirror array is provided.

Said active optical component can be, e.g., a light emitter such as an LED (light emitting diode), an SLED (superluminiscent LED), a laser diode, a VCSEL (vertical-cavity surface-emitting laser), or a light detector such as a photo diode, an array of photo diodes, a multi-pixel light detector such as an image sensor.

Through said one or more transparent portions, light can enter and/or exit the optical module. Said one or more transparent portions provide an optical connection between said opening in said third member and space located on that side of said first and second member, respectively, which is opposite to said first and second face, respectively, or, in many cases, between said opening and the outside of the optical module.

On the one hand, it may be provided that light from outside the module enters the module (through at least one of said open portions) and is reflected by the mirror element of the module. The reflected light may then be detected or used otherwise either within the module or outside the module. On the other hand, it may be provided that light generated in the module is reflected by the mirror element of the module. The reflected light may then be detected or used otherwise either within the module or rather outside the module.

Usually, it will be provided that said first and second members are fixed with respect to each other. This fixing can be directly or, if said third member is distinct from said first and second members, indirectly via said third member. Therein, bonding materials, e.g., epoxy resins, may be present between the respective members.

In one embodiment, said third member is distinct from said first and second members, and said third member is arranged between said first and second members.

In one embodiment which may be combined with the before-addressed embodiment, said mirror element substantially is a bulk optical element bonded to said second member, more particularly bonded to said second face.

In one embodiment which may be combined with the before-last-addressed embodiment, said mirror element is substantially formed by a coating applied to said second face. A coating may comprise more than one coating layers. The coating can in particular be a metallic coating. In particular flat (plane) mirror elements are particularly simply manufacturable by creating a coating on said second face.

In one embodiment which may be combined with one or more of the before-addressed embodiments, said mirror element is located within said opening.

In one embodiment which may be combined with one or more of the before-addressed embodiments, said second member comprises a third face aligned substantially parallel to said second face;

between said second and said third face, an electrically insulating base material; and at each, said second face and said third face, one or more electrically conductive tracks and/or one or more electrically conductive contact areas, e.g., contact pads.

This can result in a second member having multiple functions, more particularly optical functions and electrical functions. It can in particular be provided that said at least one active optical component is electrically connected to at least one of said electrically conductive tracks and/or electrically conductive contact areas present at said second face. More particularly, said second member comprises one or more electrical connections connecting one or more of said electrically conductive tracks and/or one or more of said electrically conductive contact areas present at said second face to one or more of said electrically conductive tracks and/or one or more of said electrically conductive contact areas present at said third face.

In one embodiment which may be combined with one or more of the before-addressed embodiments, by said second member, at least one electrical connection across the second member is provided.

Electrical connections across the second member may be conductive vias such as plated through-holes or other vertical electrical connections known from printed circuit board technology. The at least one electrical connection can, in particular, electrically interconnect the above-mentioned second face and said third face.

In one embodiment which may be combined with one or more of the before-addressed embodiments, said second member substantially is a printed circuit board or a printed circuit board assembly. The printed circuit board (PCB) can more specifically also be referred to as an interposer. A member embodied as a printed circuit board or printed circuit board assembly can provide one or more electrical connections across this respective member and provide further electrical connections.

In one embodiment which may be combined with one or more of the before-addressed embodiments, said optical module is structured and configured such that light can propagate along a light path interconnecting at least one of said transparent portions, said mirror element and said active optical component. The light path may therein, in particular, be located within the optical module.

In one embodiment which may be combined with one or more of the before-addressed embodiments, said mirror element is at least one of at least substantially made of a hardened hardenable material and obtained using a replication process. In particular, such a mirror element may, for example, comprise a coating, e.g., a metallization. This can make possible to achieve an enhanced manufacturability. In particular, embossing may be used in manufacturing the mirror element. It can be particularly efficient, if said first or said second member is manufactured, in the same process, together with said mirror element. In this particular case, also the respective member is at least substantially made of a hardened hardenable material and/or obtained using a replication process. At least the mirror element will typically be provided with a reflective coating, then.

In one embodiment which may be combined with one or more of the before-addressed embodiments, said opening is surrounded by said first, second and third members. More particularly, it can be delimited by these. Thus, a cavity is formed in the module. In said cavity, one or more passive optical components (in particular at least said mirror element) and/or one or more active optical components (in particular at least the before-mentioned active optical component) may be present. In particular, the opening or cavity encased in the module may be hermetically sealed. This may protect the inside of the module from detrimental influences such as from dust or dirt. Hence, optical components in the module can be protected this way, and light paths inside the module remain in good condition for a long time. It can be provided that said first, second and third members are the items which delimit the opening or cavity.

In one embodiment which may be combined with one or more of the before-addressed embodiments, said first, second and third members are of generally block- or plate-like shape, possibly comprising at least one hole. A wafer-level manufacture of such optical modules may be well possible.

In one embodiment which may be combined with one or more of the before-addressed embodiments, outer bounds of a vertical silhouette of the module (i.e. the outer borders of a shape described by the optical module in a projection into a lateral plane) and outer bounds of a vertical silhouette of said first, second and third members (i.e. the outer borders of a shape described by the respective member in a projection into a lateral plane) each describe a substantially rectangular shape. This can effect an enhanced manufacturability. In particular, all of the mentioned vertical silhouettes can describe one and the same rectangular shape. It can be provided that lateral outer dimensions of said first and second and third members are substantially identical. It is well possible to wafer-level manufacture such optical modules, which in turn can result in high-precision high-volume manufacturing.

In one embodiment which may be combined with one or more of the before-addressed embodiments, at least one of said first and second members, in particular both, said first and second members, are, at least in part, made substantially of at least substantially non-transparent material. Of course, said one or more transparent portions are not made of an at least substantially non-transparent material. Such a choice of material can inhibit undesired exit of light out of the optical module and/or avoid that undesired light enters the optical module. It may contribute to optically sealing the optical module, wherein, of course, the optical sealing is interrupted by the one or more transparent portions, in particular solely thereby. Accordingly, it may be provided that the first member is substantially in full, except for said one or more transparent portions, made substantially of an at least substantially non-transparent material. And, it may be provided that said second member is substantially in full made substantially of an at least substantially non-transparent material. Said non-transparent material can in particular be a polymer-based material. In particular in case of said second member, said non-transparent material can be PCB base material (rigid or flexible), a fiber-reinforced or not fiber-reinforced material, and it may be epoxy-based such as FR4 or polyimide.

In one embodiment which may be combined with one or more of the before-addressed embodiments, said third member is, at least in part, made substantially of an at least substantially non-transparent material. This may contribute to optically sealing the optical module.

In one embodiment which may be combined with one or more of the before-addressed embodiments, said third member is at least one of made of a hardened hardenable material and obtained using a replication process. This can make possible to achieve an enhanced manufacturability. This can make possible to provide third members in form of unitary parts in an efficient way and in high precision.

In one embodiment which may be combined with one or more of the before-addressed embodiments, said third member is a unitary part, in particular wherein said third member is distinct from said first and second members. This can enhance the manufacturability of the third member.

Typically, said third member, in particular when it is distinct from said first and second members, has a vertical extension which is limited to the vertical range from said first face to said second face.

Generally, a third member, more particularly a separate third member, can also be referred to as a spacer or spacer member or distancing member, because it can effect a well-defined (vertical) distance between the first and second members more particularly between said first and second faces.

In one embodiment which may be combined with one or more of the before-addressed embodiments, the optical module comprises, in addition, at least one of
 a passive optical component, in particular at least one of an at least partially reflective element, a refractive element and a diffractive element; and
 another active optical component, in particular a light emitting element or a light detecting element.

This can make possible to realize relatively elaborate optical setups in the module.

In one embodiment which may be combined with one or more of the before-addressed embodiments, the module comprises an inside volume and a housing enclosing said inside volume, said inside volume being comprised in said opening, said housing being, except for said one or more transparent portions, completely non-transparent, such that light can enter or exit said inside volume solely through said one or more transparent portions. In particular, it may be provided that said third member and at least one of said first and second members contribute to said housing or, more particularly, form said housing. Even more particularly, it may be provided that said first, second and third members all contribute to said housing or, still more particularly, even form said housing. A very compact packaged optical module may be realized in such a way. And the optical module can be realized using a very small number of parts only. Therein, it is possible to provide that not only the first but also the second member comprises at least one transparent portion.

In one embodiment which may be combined with one or more of the before-addressed embodiments, a maximum vertical extension of the module is at most 25 mm, in particular at most 12 mm.

In one embodiment which may be combined with one or more of the before-addressed embodiments, a maximum lateral extension of the module is at most 30 mm, in particular at most 15 mm.

The wafer comprises a multitude of mirror elements. Such a wafer can be used in mass production of optical modules of the above-described kind or of other optical modules, e.g., possibly not comprising an active optical component. After a separation step in which a wafer stack comprising this wafer is separated into a multitude of parts, the corresponding portions of the wafer can in particular be what is described above as second members, and they may have corresponding properties as described above. In particular:

In one embodiment of the wafer, a multitude of active optical components are mounted on a face of said wafer. Said face can in particular be a vertical face. And it can be provided that said active optical components are in electrical contact with the wafer at said face. And it can be provided that said mirrors are present at and distributed over said face.

In another embodiment of the wafer, which may be combined with the before-addressed wafer embodiment, said wafer substantially is a printed circuit board.

The method for manufacturing a wafer comprising a multitude of mirror elements comprises at least one of the steps of
- A) placing said multitude of mirror elements on a face of said wafer using pick-and-place;
- B) providing a face of said wafer with a multitude of coated areas when forming said multitude of mirror elements; and
- C) carrying out one or more replication steps when forming said multitude of mirror elements.

In particular, the before-described wafers can be manufactured using this method. Step A) as well as step B) and step C) are well suitable for mass production. In case of step A), bulk optical elements can be positioned on the wafer using a technology known from electronics industry. In case of step B), a multitude of mirrored regions can be formed on the wafer which usually have optical quality. It is possible to firstly create a base coating for creating a flat (and possibly not yet reflective) regions leveling a possibly existing unevenness or roughness of the wafer, and then apply a reflective coating on the base coating. In case of step C), the mirror elements are manufactured using replication, and they may be provided with a coating.

The appliance comprises a multitude of optical modules described above and/or comprises a wafer described above. The appliance can in particular be a wafer stack.

In one embodiment of the appliance, the appliance comprises a multitude of optical modules described above and
- a first wafer comprising a multitude of said first members;
- a second wafer comprising a multitude of said second members;
- a third wafer comprising a multitude of said third members, wherein said third wafer is comprised in said first wafer or is comprised in said second wafer or is distinct from these;
- a multitude of said mirror elements; and
- a multitude of said active optical components.

Such an appliance or wafer stack is particularly useful for mass-producing above-described optical modules.

It is also possible to provide an appliance without said multitude of active optical components. Accordingly, also optical modules manufactured using such an appliance of wafer stack may be such that they comprise no active optical component.

The method for manufacturing an optical module comprises the steps of
- a) providing a first wafer;
- b) providing a second wafer on which a multitude of mirror elements are present;
- c) providing a third wafer, wherein said third wafer is comprised in said first wafer or is comprised in said second wafer or is distinct from these, and wherein said third wafer comprises a multitude of openings;
- e) forming a wafer stack comprising said first wafer, said second wafer and said third wafer;

wherein at least one of said first wafer and said second wafer comprises a multitude of transparent portions through which light can pass.

This way, efficient mass-production of optical modules of high precision may be achieved.

In particular, the method is a method for manufacturing a multitude of optical modules.

The optical modules manufactured using this method can in particular be the above-described optical modules.

In one embodiment of the method, step b) comprises the step of
- b1) placing said multitude of mirror elements on said second wafer using pick-and-place.

This may be particularly useful when the mirror elements are manufactured separately from said first, second and third wafers. The mirror elements may be, e.g., bulk optical elements.

In another embodiment of the method, step b) comprises the step of
- b2) applying a coating during manufacture of said multitude of mirror elements.

More particularly, said coating can be applied to said second wafer.

In one embodiment which may be combined with one or more of the before-addressed method embodiments, on said second wafer, a multitude of active optical components are present. These active optical components can in particular be mounted on said second wafer and, more particularly, on the same face of the second wafer on which also said mirror elements are present. It can be provided that said active optical components are in electrical contact to a face of said second wafer.

In one embodiment referring to the last-addressed embodiment, the method comprises the step of
- b3) positioning said multitude of active optical components on said second wafer using pick-and-place.

In one embodiment which may be combined with one or more of the before-addressed method embodiments, step e) comprises the step of
- e1) arranging said first, second and third wafers such that said third wafer is arranged between said first and second wafers and that each of said multitude of mirror elements is allocated with an opening of said multitude of openings and with one of said multitude of transparent portions.

This way, efficient mass-production of optical modules of high precision may be achieved. If the before-addressed multitude of active optical components is present, each of the mirror elements is also allocated with one of said active optical components.

In one embodiment which may be combined with one or more of the before-addressed method embodiments, step b) comprises the step of
- b4) carrying out a replication step during manufacture of said multitude of mirror elements.

In particular, said replication step is carried out on said second wafer.

Said replication step can in particular be an embossing step.

Said multitude of mirror elements can be manufactured using a replication step or replication process which can result is an excellent mass producibility.

In particular, it may be provided that the entire multitude of mirror elements is substantially manufactured in one process. If all of the mirror elements of said multitude of mirror elements is are manufactured simultaneously, in particular on wafer-level, mass production may be readily accomplished. After the replication process, a coating process may be applied for creating a coating of the mirror elements.

In one method embodiment, each of the mirror elements is formed, at least in part, in a common replication step or replication process together with said second wafer.

A replication step or replication process, in general, comprises usually the steps of
- i) depositing replication material on a face of a wafer;
- ii) bringing a replication tool into contact with said replication material;
- iii) hardening said replication material, in particular curing it, e.g., by heating or by irradiation, e.g., with UV radiation;
- iv) removing said replication tool.

In step i), said face can in particular be a face corresponding to the above-mentioned second face.

In one embodiment which may be combined with one or more of the before-addressed embodiments, the method comprises at least one of the steps of
n1) manufacturing said first wafer using a replication process, in particular embossing;
n2) manufacturing said second wafer using a replication process, in particular embossing;
n3) manufacturing said third wafer using a replication process, in particular embossing.

It is furthermore possible to provide, in the method, the step of
q) manufacturing said multitude of transparent portions or a portion of these using a replication process, in particular embossing.

In one embodiment which may be combined with one or more of the before-addressed embodiments, the method comprises at least one of the steps of
f) separating said wafer stack into said multitude of optical modules.

In particular, it can be provided that each of said optical modules comprises
at least one of said multitude of transparent portions;
at least one of said multitude of mirror elements; and
at least one of said multitude of openings.

Each of said optical modules can be an optical module as described further above in the present patent application.

Said separating can be accomplished using known dicing techniques, e.g., sawing, laser cutting and others.

The invention comprises optical modules with features of corresponding manufacturing methods according to the invention, and, vice versa, also manufacturing methods with features of corresponding optical modules according to the invention.

The advantages of the optical modules basically correspond to the advantages of corresponding methods, and, vice versa, the advantages of the methods basically correspond to the advantages of corresponding optical modules.

The device comprises an optical module of the above-described kind. In particular, it also comprises a printed circuit board on which said optical module is mounted. The device can in particular be an electronic device, a smart phone, a photographic device, an optical communication device, an optical device, a spectrometer device. Under "optical communication device", we understand an optical component for use in optical data transmission, more particularly in optical digital data transmission, even more particularly in data transmission for optical telecommunication. Usually, an optical communication device has at least one input port for receiving light and at least one output port for outputting light. And typically, in the optical communication device, some processing is applied to inputted light, which may be at least one of amplifying, focussing, defocusing, filtering, optical filtering, separating, dividing, splitting, merging.

The method for manufacturing a device comprising an optical module comprises manufacturing the optical module according to an above-described method. And furthermore, the optical module may be an optical module of an above-described kind.

Further embodiments and advantages emerge from the dependent claims and the figures.

BRIEF DESCRIPTION OF THE DRAWINGS

Below, the invention is described in more detail by means of examples and the included drawings. The figures show in a schematized manner.

The described embodiments are meant as examples and shall not confine the invention.

DETAILED DESCRIPTION OF THE INVENTION

Figure 1:
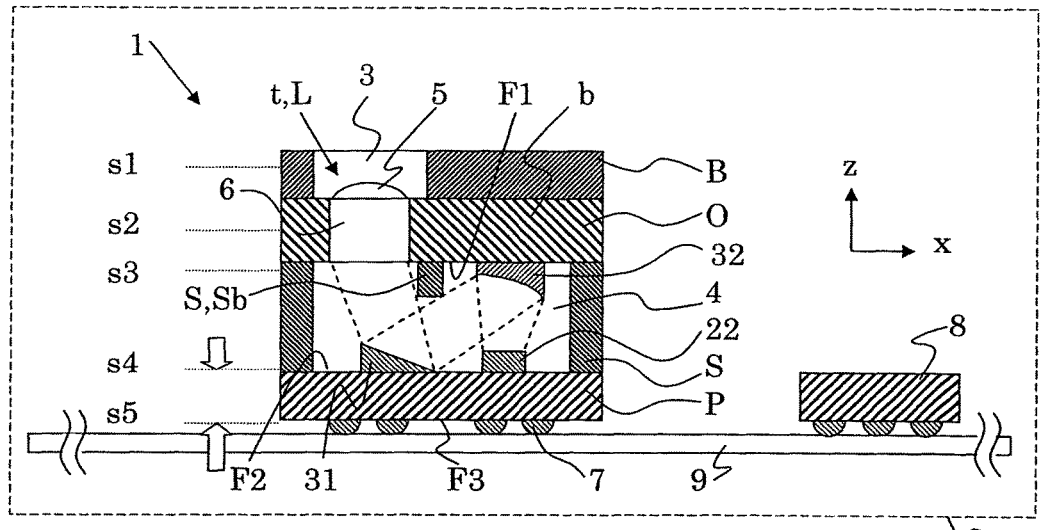
FIG. 1 a cross-sectional view of a device comprising an optical module.
Figure 2:
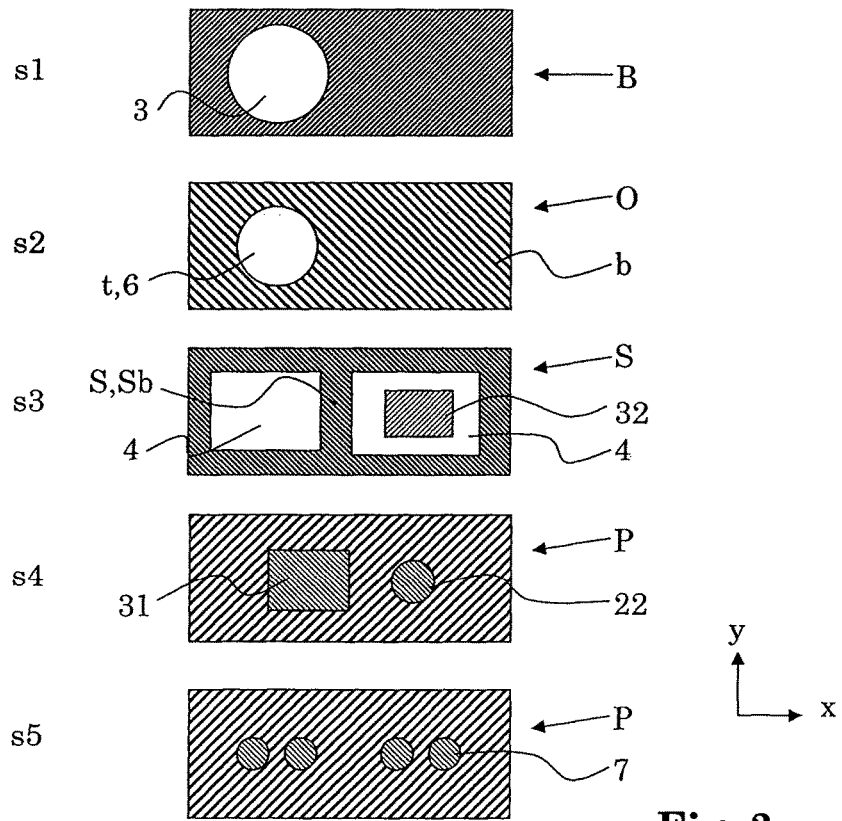
FIG. 2 various cross-sectional views of constituents of the optical module of FIG. 1.

FIG. 1 shows a schematic cross-sectional view of a device 10 comprising an optical module 1, wherein the optical module in particular is an opto-electronic module 1. The illustrated cross-section is a vertical cross-section. FIG. 2 shows various lateral schematic cross-sectional views of constituents of the module of FIG. 1, wherein the approximate positions of these lateral cross-sections are indicated in FIG. 1 by s1 to s5 and dotted lines. For s4 and s5, the direction of view is indicated by arrows.

Device 10 can be, e.g., an electronic device and/or a photographic device. It comprises, besides module 1, a printed circuit board 9 on which module 1 is mounted. In addition mounted on printed circuit board 9 is an integrated circuit 8 such as a control unit 8 or a controller chip which is operationally interconnected with module 1 by printed circuit board 9. E.g., integrated circuit 8 may evaluate signals outputted by module 1 and/or provide signals to module 1 for controlling the same.

Module 1 comprises several constituents (P, S, O, B) stacked upon each other in a direction through which the term "vertical" is defined; it corresponds to the z direction (cf. FIG. 1). Directions in the x-y plane (cf. FIG. 2) perpendicular to the vertical (z) direction are referred to as "lateral".

Module 1 comprises a substrate P, a separation member S (which can also be referred to as spacer), an optics member O and an optional baffle member B stacked upon each other. Substrate P is, e.g., a printed circuit board assembly, but might be merely a printed circuit board. The printed circuit board (PCB) of this PCB assembly can more specifically also be referred to as an interposer. On the PCB, an active optical component such as a light emitter 22 is mounted and a passive optical component 31, too. Passive optical component 31 more specifically is a mirror element 31 (or reflective element), e.g., a mirrored prism. Optical elements 22 and 31 are present on a face F2 of substrate P. On or at optics member O, another passive optical component 32 is arranged which more specifically is a mirror element 32 (or reflective element), e.g., a curved mirror. Mirror element 32 is present on a face F1 of optics member O. Faces F1 and F2 are substantially flat and arranged parallel to each other.

Electrical contacts of active optical component 22 are electrically connected to the outside of module 1 by and via substrate P, where solder balls 7 are attached at a face F3 of substrate P. Instead of providing solder balls 7, it would also be possible to provide contact pads on the PCB (substrate P) which are not (or at a later time) provided with solder balls.

This way, module 1 can be mounted on printed circuit board 9, e.g., in surface mount technology (SMT), next to other electronic components such as controller 8. Module 1 is particularly suitable for an application in a compact electronic device 10 such as in a hand-held communication device, because it can be designed and manufactured to have a particularly small size.

Separation member S has an opening 4 in which the active and passive optical components, respectively (22, 31, 32), are arranged. This way, these items are laterally encircled by separating member S (cf. FIGS. 1 and 2).

Separation member S may fulfill several tasks. It can ensure a well-defined distance between substrate P and optics member O (through its vertical extension) which helps to achieve well-defined light paths within the module. Separation member S can also inhibit the propagation of light generated by active optical component 22 out of module 1 via undesired light paths. This is accomplished by separation member S forming a portion of the outside walls of module 1, separation member S being, e.g., made substantially of a non-transparent material. Typically, separating member S is made of a polymer material, in particular of a hardenable or, more specifically, curable polymer material, e.g., of an epoxy resin. If separating member S is made of a substantially non-transparent curable material, it can in particular be a heat-curable material.

Optics member O comprises a blocking portion b and a transparent portion t, the latter for allowing light emitted by active optical component 22 to leave module 1. Blocking portion b is substantially non-transparent for light, e.g., by being made of a suitable (polymer) material, e.g., like described for separating member S. Transparent portion t comprises a passive optical component L or, more particularly and as an example, a lens member L, for light guidance. Lens member L may, e.g., comprise, as shown in FIG. 1, a lens element 5 in close contact to a transparent element 6. Transparent element 6 can have the same vertical dimension as optics member O where it forms blocking portion b, such that optics member O where it forms blocking portion b together with transparent element 6 describes a (close-to-perfect) solid plate shape. Lens element 5 redirects light by refraction (cf. FIG. 1) and/or by diffraction (not illustrated in FIG. 1). Lens element 5 may, e.g., be of generally convex shape (as shown in FIG. 1), but lens element 5 may be differently shaped, e.g., generally or partially concave. It is furthermore possible (not shown) to provide another optical structure on the opposite side of transparent element 6.

Baffle member B is optional and allows to shield undesired light, in particular light leaving module 1 in an desired angle. Usually, baffle member B will have a transparent region 3 which may be embodied as openings or by means of transparent material. Baffle member B can, outside transparent region 3, be made of a material substantially attenuating or blocking light, or it could be provided with a coating having such a property, wherein the latter will usually be more complex to manufacture. The shape of baffle member B or, more precisely, of the transparent region 3, can, of course, be different from what is shown in FIGS. 1 and 2, and it may, e.g., describe a cone-like shape or a truncated pyramid.

The lateral shape not only of the transparent regions 3, but also of the transparent portions t and of the openings 4 do not have to be like drawn in FIG. 2, but may have other appearances, e.g., polygonal or rectangular with rounded corners or elliptic.

Coming back to separation member S, it does not solely comprise laterally defined regions in which separation member S extends vertically to a maximum extent, namely to the extent substantially defining the vertical distance between substrate P and optics member O, and to laterally defined regions in which it is completely free of material forming an opening vertically fully traversing said maximum vertical extension. But there is a region in which (usually non-transparent) material of separation member S extends vertically along only a portion of said maximum vertical extension, namely in the region of spacer portion Sb. Thus, spacer portion Sb can function as a light shield for light inside module 1 (cf. FIG. 1). It can prevent a propagation of light along undesired paths. In particular if separation member S is manufactured using replication, the extra functionality of separation member S provided by spacer portion Sb is readily achieved, at nearly no cost in terms of manufacturability and manufacturing steps.

Instead of being a light-emitting module 1 comprising a light emitting member 22 as an active optical component, it could also be provided that the active optical component is a detection member for detecting light, such as an image detector or a photo diode. In this case, separation member S could also be provided for protecting the detection member from light that is not supposed to be detected by the detection member, by being substantially non-transparent and by forming a portion of the outside walls of module 1 and, if provided, by forming a light shield by spacer portion Sb. And furthermore, transparent portion t could then be provided for allowing light to enter module 1 from the outside of module 1 and reach the detecting member.

Figure 15:
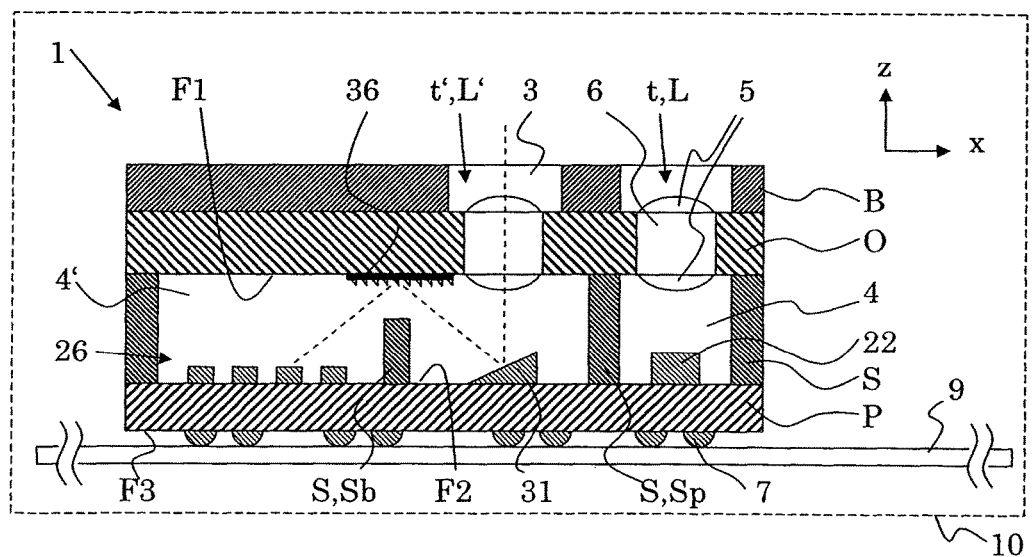
FIG. 15 a cross-sectional view of a device comprising an optical module having two channels.

And, it is also possible to provide, in one module 1, a light emitting member and a detection member (not illustrated in FIGS. 1 to 4, but in FIG. 15). Both would usually, for accomplishing electric contacts of these active optical components to the outside of module 1, be mounted on a substrate P. Such a module could be used, e.g., for investigating the environment of module 1 by emitting light out of module 1 and detecting and possibly analyzing light having interacted with an object in the environment of module 1.

And furthermore, it is possible to provide modules which are designed according to the same principles as discussed above, but comprising, in addition to one or two active optical components, one or more additional electronic components such as additional light detectors, and/or one or more integrated circuits, and/or two or more light sources.

Module 1 of FIGS. 1 to 4 is an opto-electronic component, more precisely a packaged opto-electronic component. The vertical side walls of module 1 are formed by items P, S, O and B. A bottom wall is formed by substrate P, and a top wall by baffle member B or by baffle member B together with optics member O, or, in case no baffle member B is provided, by optics member O alone.

As is well visible in FIG. 2, the four items P, S, O, B, which can for the reasons above also be referred to as housing components (contributing to a housing of module 1), all have substantially the same lateral shape and lateral dimensions. This is related to a possible and very efficient way of manufacturing such modules 1 which is described in more detail below referring to FIGS. 3 and 4. These housing components P, S, O, and B are all of generally block- or plate-like shape or, more generally, of generally rectangular parallelepiped shape, possibly having holes or openings (such as baffle member B and separation member S do) or (vertical) projections (such as optics member O does due to optical structure 5).

Passive optical components 31 and 32 and active optical component 22 are arranged such that light can propagate inside module 1 along an optical path interconnecting these components and transparent portion t. Transparent portion t being arranged separate from optical element 32 provides that said optical path has a lateral component (along the x direction). The angled alignment of mirror element 31 contributes to a suitable optical path. The presence of a mirror element such as mirror element 31 on face F2 makes possible to realize long and elaborate light paths in a module 1. With mirror element 31 being present on substrate P being a printed circuit board, substrate P, in addition to providing electrical connections (within module 1 and/or between module 1 and one or more further components such as printed circuit board 9 of device 10), also functions as a carrier (or substrate) for an optical element, more precisely for a mirror element. Of course, substrate P may have still further functions such as those mentioned further above; it may contribute to the module housing and may contribute to optically separating the inside of module 1 from space outside module 1.

Active electronic components comprised in a module 1 (such as emission member 22 in the example of FIG. 1) can be packaged or unpackaged electronic components. For contacting substrate P, technologies such as wire-bonding or flip chip technology or any other known surface mount technologies may be used, or even conventional through-hole technology. Providing active optical components as bare dice or chip scale packages allows to realized particularly small designs of modules 1, yet also active optical components packaged in a different way may be comprised in a module 1.

Figure 3:
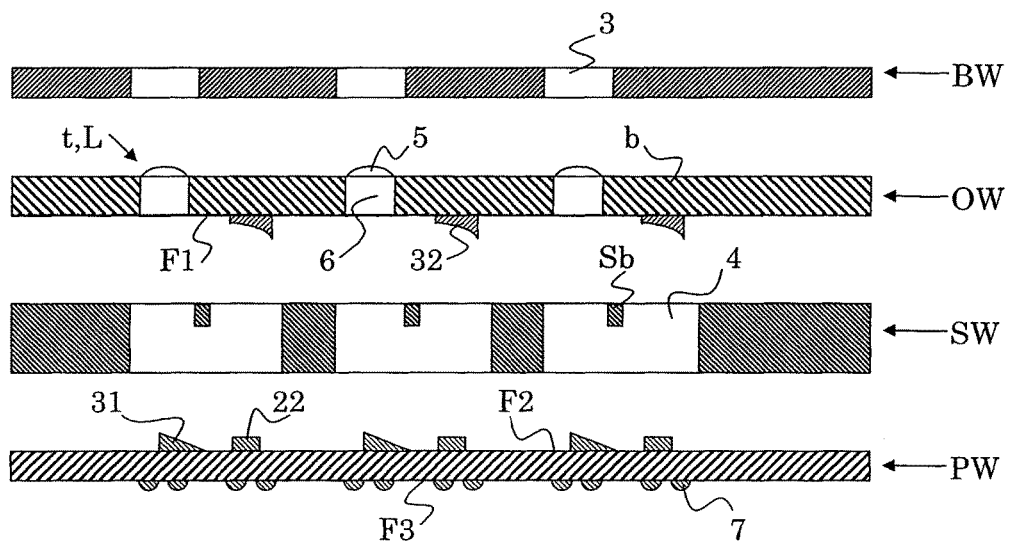
FIG. 3 a cross-sectional view of wafers for forming a wafer stack for manufacturing a multitude of optical modules of FIG. 1.

FIG. 3 shows a schematical cross-sectional view of wafers for forming a wafer stack 2 for manufacturing a multitude of modules as shown in FIGS. 1 and 2. It is possible to manufacture such modules 1 (practically) completely on wafer-scale, of course with a subsequent separation step. Although FIGS. 3 and 4 only show provisions for three modules 1, there will usually be in one wafer stack provisions for at least 10, rather at least 30 or even more than 50 modules in each lateral direction. Typical dimensions of each of the wafers are: laterally at least 5 cm or 10 cm, and up to 30 cm or 40 cm or even 50 cm; and vertically (measured with no components arranged on substrate wafer PW) at least 0.2 mm or 0.4 mm or even 1 mm, and up to 6 mm or 10 mm or even 20 mm.

Four wafers (or, with no baffle wafer provided: three wafers) are sufficient for manufacturing a multitude of modules as shown in FIG. 1: A substrate wafer PW, a spacer wafer SW, an optics wafer OW and optional baffle wafer BW. Each wafer comprises a multitude of the corresponding members comprised in the corresponding module 1 (cf. FIGS. 1 and 2), usually arranged on a rectangular lattice, typically with a little distance from each other for a wafer separation step.

Substrate wafer PW can be a PCB assembly comprising a PCB of standard PCB materials such as FR4, provided with solder balls 7 on the one side and with one or more optical elements (in FIG. 1: active optical component 22 and passive optical component 32) connected (e.g., soldered or glued) to the other side. The optical elements can be placed on substrate wafer PW, e.g., by pick-and-place using standard pick-and-place machines. Similarly, passive optical component 32 may be placed on optics wafer OW. Alternatives for providing passive optical components and in particular mirror elements on a substrate are discussed below, cf. FIGS. 8 and 9.

When optical elements are provided on a wafer, it is important to ensure that they are sufficiently accurately positioned with respect to each other.

In order to provide maximum protection from undesired light propagation, all wafers PW, SW, OW, BW can substantially be made of a material substantially non-transparent for light, of course except for transparent areas such as transparent portions t and transparent regions 3.

Wafers SW and BW and possibly also all or a portion of wafer OW may be produced by replication or at least using replication. In an exemplary replication process, a structured surface is embossed into a liquid, viscous or plastically deformable material, then the material is hardened, e.g., by curing using ultraviolet radiation or heating, and then the structured surface is removed. Thus, a replica (which in this case is an negative replica) of the structured surface is obtained. Suitable materials for replication are, e.g., hardenable (more particularly curable) polymer materials or other replication materials, i.e. materials which are transformable in a hardening step (more particularly in a curing step) from a liquid, viscous or plastically deformable state into a solid state. Replication is a known technique, cf., e.g., WO 2005/083789 A2 for more details about this.

In case of optics wafer OW, replication or molding may be used for obtaining the non-transparent portion (blocking portion b). It would also be possible to provide holes, where transparent portions t are supposed to be, by drilling or by etching.

Subsequently, a so-obtained precursor wafer substantially comprised of blocking portion b is provided with lens members L and passive optical components 22. The former may be accomplished by means of replication, e.g., forming lens members L as a unitary parts, e.g., as described in US 2011/0043923 A1. The lens members L can, however, also be manufactured starting from a semi-finished part being a wafer comprising transparent elements 6 within holes by which transparent regions 3 are defined. This can be particularly useful when the lens members L each describe at least one apex, and those apices are located outside a vertical cross-section of the optics wafer OW. Such a semi-finished part is (usually and in the exemplary case shown in the figures) a flat disk-like wafer having no holes penetrating the wafer in the transparent regions 3 and having virtually no or only shallow surface corrugations, such surface corrugations usually being concave, i.e. not extending beyond the wafer surface as described by the blocking portions b.

A semi-finished part like that can be obtained starting from a flat precursor wafer (typically made of a single, possibly composed material) having holes or openings where the transparent portions t are supposed to be and then filling the holes with transparent material, e.g., using a dispensing process, and either filling the holes in the precursor wafer one-by-one, e.g., using a dispenser such as used for underfilling processes in flip-chip technology or the like, or by filling several holes at once, e.g., using a squeegee process (e.g., as known from screen printing) or a dispenser with several hollow needles outputting material. During the dispensing, the wafer can be placed on a flat support plate, e.g., made of a silicone. Care has to be taken inorder to prevent the formation of air bubbles or cavities in the dispensed material, since this would degrade the optical properties of the lens members L to be produced. E.g., one can carry out the dispensing in such a way that wetting of the wafer material starts at an edge formed by the wafer and an underlying support plate (or in a place close to such an edge), e.g., by suitably guiding a hollow needle outputting the material close to such an edge. Subsequently, the dispensed material is cured, e.g., by heat or UV radiation, so as to obtain hardened transparent material.

Convex meniscuses possibly formed this way can be flattened by polishing, so as to obtain a transparent element 6 having parallel surfaces adjusted to the wafer thickness. Then, by means of replication, optical structures 5 (lens elements 5) are applied to one or both sides (top and button side) of wafer OW. In case of concave meniscuses of the transparent elements, the replication can take place on these, wherein the amount of applied replication material might have to be adjusted accordingly.

It is generally possible to provide that said spacer wafer SW and/or said baffle wafer BW are obsolete in the sense that a particular kind of optics wafer is provided which comprises one or both of these wafers, i.e. in this case, the respective wafer is or respective wafers are a portion of optics wafer. Such an optics wafer ("combined optics wafer") incorporates the features and functionalities of said spacer wafer SW and/or of said baffle wafer BW. Producing such a "combined optics wafer" may be accomplished using a particular precursor wafer and, manufactured based thereon, a particular semi-finished part. Such a precursor wafer and semi-finished part, respectively, has at least one structured surface, usually having protrusions extending vertically beyond at least one of the two surfaces of transparent elements to be provided in the precursor wafer and present in the semi-finished part, respectively. Looking upon wafers OW and SW (or wafers OW and BW, or wafers OW and SW and BW) in FIG. 4 as one single part, it can be readily visualized what a corresponding optics wafer ("combined optics wafer") for manufacturing a module according to FIG. 1 and also a corresponding semi-finished part would look like.

In general, it is also, as a partial alternative to the above, possible to provide that spacer wafer SW is a portion of substrate wafer PW. In this case, substrate wafer PW would rather not be made of standard PCB materials, but of a replication material.

Figure 9A:
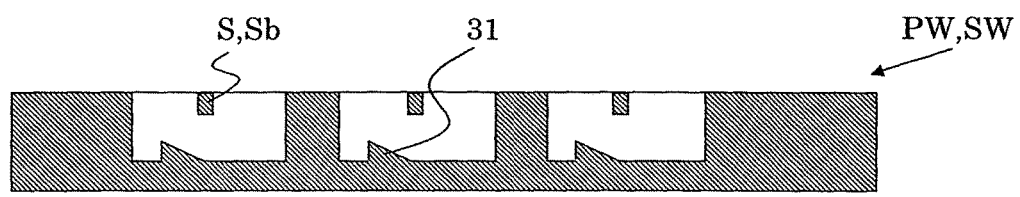
FIGS. 9a, 9b vertical cross-sections through a wafer, for illustrating a method for manufacturing a wafer and mirror elements.
Figure 9B:
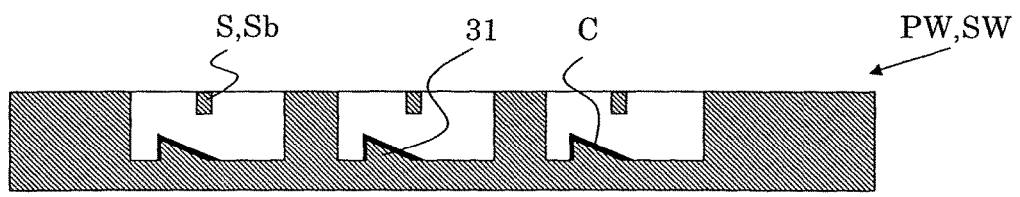

FIGS. 9a, 9b illustrate one way how a wafer and mirror elements 31 can be manufactured. FIG. 9a, 9b are vertical cross-sections through a "combined" wafer uniting the functionalities of substrate wafer PW and spacer wafer SW. That wafer in addition comprises mirror elements 31 except for a coating to be applied in order to achieve a desired reflectivity of the mirror elements 31, cf. FIG. 9a. In FIG. 9b, a corresponding reflective coating C is present, typically a metallic coating. Coating C may be applied electrochemically or from the gas phase (e.g., using a physical vapor deposition technique), and may, if not applied specifically locally (e.g., using a mask), be structured, e.g., using lithographic processes, e.g., photolithographic etching.

The wafer illustrated in FIG. 9a may be manufactured using replication, More specifically, it can be manufactured using injection molding. If spacer portions Sb were not present, the wafer could well be manufactured using embossing.

In case the wafer illustrated in FIG. 9b shall incorporate the function of a printed circuit board, corresponding conductive tracks and/or conductive areas (such as contact pads) could be created using similar processes as those used for creating coating C (such as coating and etching), and it is even possible to create the conductive tracks and/or conductive areas simultaneously with coating C, i.e. in same processing steps. Through-holes, if present, can be provided in the replication step. They may simply be provided in an injection mold used for injection molding the wafer.

FIG. 8 illustrates another way of providing the mirror elements 31 on a wafer. In this case, the wafer is a substrate wafer PW not incorporating the functionality of a spacer wafer; but generally, it would also be possible to create, in the illustrated way, the mirror elements 31 on a "combined" wafer combining functionalities of substrate wafer and spacer wafer. FIGS. 8a-8f are vertical cross-sections through the wafer, illustrating different method steps.

Figure 8A:
FIGS. 8a-8f vertical cross-sections through a wafer, for illustrating a method for manufacturing a wafer and mirror elements.
Figure 8B:
Figure 8C:
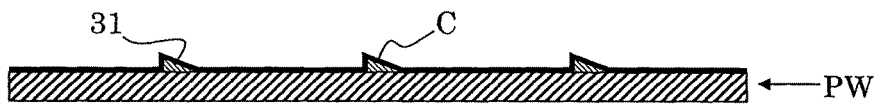
Figure 8D:
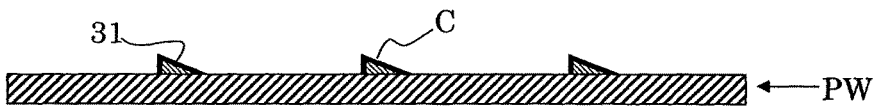
Figure 8E:
Figure 8F:

In FIG. 8a, it is illustrated that replication material 39 is applied to a wafer. That wafer can be a substrate wafer and may be a printed circuit board with or, as illustrated in FIG. 8a, without active optical components and/or solder balls. FIG. 8b illustrates the result after a replication step, in particular after an embossing step. The replication material is shaped and hardened (cured) and forms mirror elements 31, but still without a reflective coating. In FIG. 8c, a coating C is applied in an unstructured way. Then, the coating is structured, e.g., using an etching mask, resulting in the wafer illustrated in FIG. 8d. Alternatively, a mask could be used for applying the coating, e.g., during evaporating a suitable metal. FIG. 8e illustrates the wafer after placing active optical components 22 thereon, e.g., using a pick-and-place machine commonly used in electronics industry. FIG. 8f illustrates the finished wafer obtained after providing (optional) solder balls 7. Solder balls 7 and active optical components 22 could also be provided at an arbitry earlier step, e.g., even already before depositing the replication material 39 (cf. FIG. 8a).

Coming back to FIGS. 1 to 4. In order to form a wafer stack 2, the wafers are aligned and bonded together, e.g., by gluing, e.g., using a heat-curable epoxy resin. It is usually a critical point to ensure that each optical element on substrate wafer SW (such as active optical component 22 and passive optical component 31) is sufficiently accurately allocated with the optical elements of optics wafer OW (such as passive optical component 32) and with transparent portion t.

It is to be noted that passive optical component 31 and/or passive optical component 32 may be a diffraction grating instead of a purely specular mirror.

Figure 4:
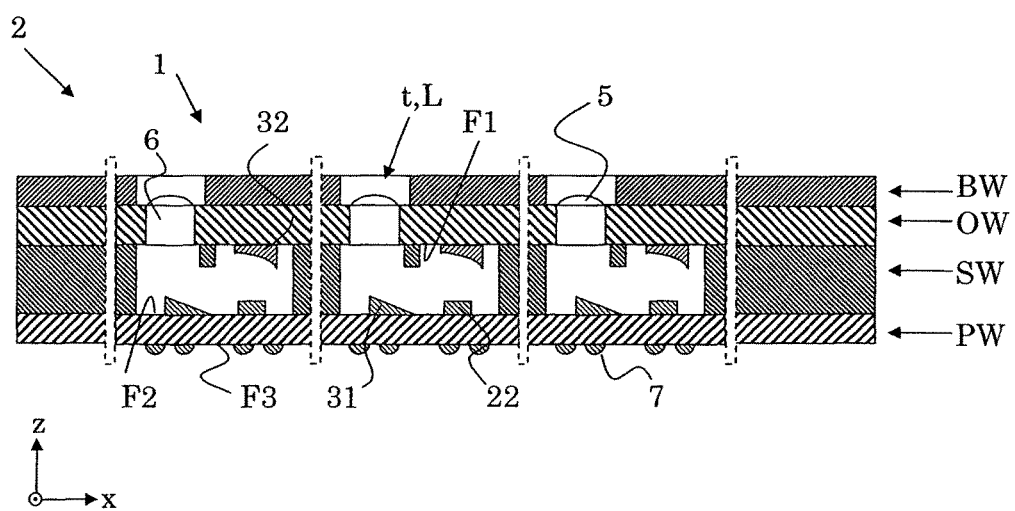
FIG. 4 a cross-sectional view of a wafer stack for manufacturing a multitude of optical modules of FIG. 1.

FIG. 4 shows a cross-sectional view of a so-obtained wafer stack 2 for manufacturing a multitude of modules 1 as shown in FIG. 1. The thin dashed rectangles indicate where separation takes place, e.g., by means of using a dicing saw or by laser cutting.

The fact that most alignment steps are carried out on wafer level makes it possible to achieve a good alignment of the optical elements in a rather simple and very fast way. Thus, a well-defined optical path can be realized for light inside module 1. The overall manufacturing process is very fast and precise. Due to the wafer-scale manufacturing, only a very small number of production steps and parts (or members) is required for manufacturing a multitude of modules 1.

Following the before-presented ideas, various other optical modules 1 may be construed and manufactured. In the following, some examples are described.

Figure 5:
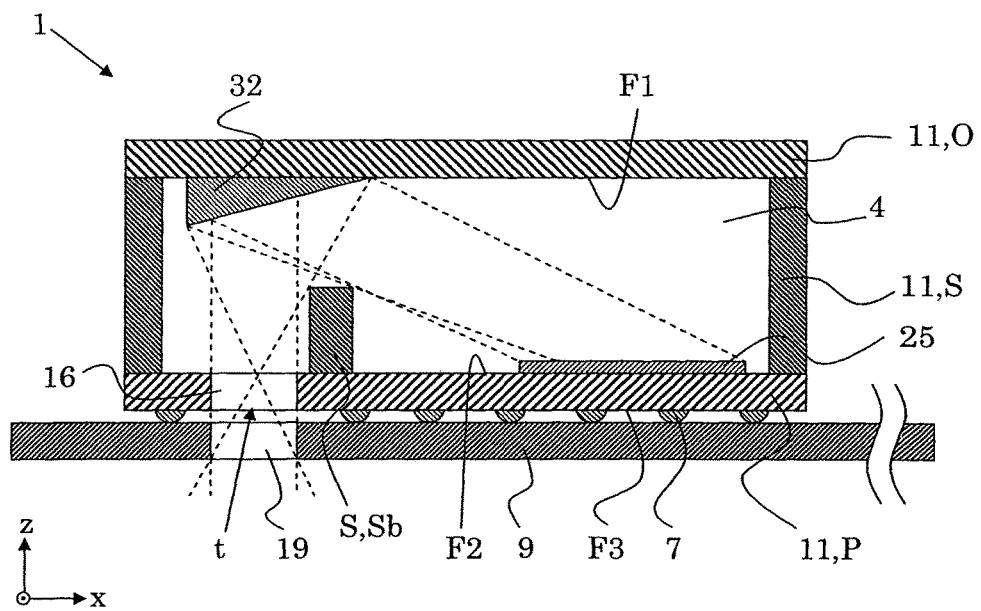
FIG. 5 a cross-sectional view of an optical module on a printed circuit board.

FIG. 5 shows a cross-sectional view of an optical module 1 on a printed circuit board 9. In contrast to the module of FIG. 1, the transparent portion t is not provided in optics member O, but in substrate member P. Being mounted on PCB 9, a through-hole 19 is provided therein so as to allow light to enter (or exit) module 1 therethrough and through transparent portion t. Through-hole 19 can function as a baffle, limiting the angular range under which light can enter module 1. Due to the (according to optical standards) very limited positioning accuracy achievable by mounting on a PCB, through-hole 19 will usually be designed to have a larger lateral extension than transparent portion t has.

Furthermore, another possible variant for transparent portion t is illustrated in FIG. 5. In the illustrated case, transparent portion t is merely an opening in housing 11 of module 1. A transparent element like transparent element 6 in FIGS. 1 to 4 could also be provided in transparent portion t; this would contribute to avoid that undesired particles like dust could enter module 1. And, on one or both sides of such a transparent element 6, a lens element might be provided. Like in the example of FIGS. 1 to 4, the housing 11 of module 1 is substantially constituted by the comprised members O, S, P (in FIGS. 1 to 4 also the optional member B).

Active optical component 25 of module 1 of FIG. 5 can be a light detector, e.g., a pixel array, e.g., an image sensor. Passive optical component 32 can, e.g., be an optical mirror on a prism. Thus, a mirror element is, in an embodiment according to FIG. 5, present, but present on a wafer which is not a printed circuit board. Spacer portion Sb can contribute to preventing the detection by active optical component 25 of stray light entering module 1 in undesired ways.

This way, module 1 of FIG. 5 can be used, e.g., for imaging light entering the module. If it is provided that passive optical component 32 is a diffraction grating, module 1 of FIG. 5 can be used, e.g., for spectrally analyzing light entering the module. Via solder balls 7, signals obtained by active optical component 25 can be fed to an evaluation unit operationally interconnected to PCB 9, e.g., to an integrated circuit like item 8 in FIG. 1.

In another interpretation of FIG. 5, active optical component 25 is a light emitter, and passive optical component 32 is a (purely specular) mirror element. In this case, module 1 could be a projector for projecting images. E.g., the light emitter would be a multi-pixel light emitter generating a full image frame at a time, and passive optical component 32 would be a flat or (not illustrated: a curved) mirror. But it could also be provided that the light emitter produces only one pixel or a portion of a full frame at a time, and item 32 would be a digital micromirror device creating a full image by subsequently guiding light emitted by the light emitter to different directions. In any of these cases, one or more lenses in transparent portion t might allow to achieve an improved image quality.

Figure 6:
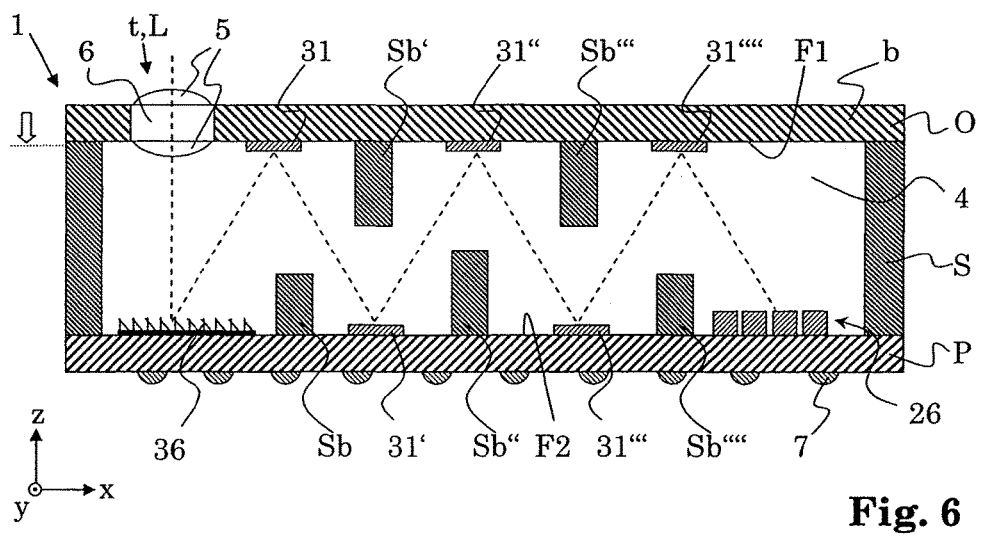
FIG. 6 a cross-sectional view of an optical module comprising a diffraction grating.

Another optical module 1 is illustrated in FIG. 6 in a cross-sectional view. Therein, transparent portion t comprises a lens member L comprising a transparent element 6 to which on two opposing sides a lens element 5 each is attached, e.g., manufactured by replication on wafer level. On substrate member P, an arrangement 26 of photo diodes is arranged, e.g., in a linear arrangement. Furthermore arranged on substrate P are three passive optical components 36, 31', 31'''. Passive optical component 36 is a reflection diffraction grating 36, and passive optical components 31', 31''' are embodied as (plane) optical mirrors. Grating 36 may be manufactured using replication, in particular on wafer level, or it may be a (pre-fabricated) grating placed on substrate P, e.g., by pick-and-place. On optics member O, three passive optical components 31, 31'', 31'''' are arranged which are embodied as (plane) optical mirrors.

The mirror elements (or at least a portion thereof) may be pre-fabricated (bulk-optical) mirrors placed on the respective member, e.g., by pick-and-place, or may be realized by applying a coating to the respective member (O and P, respectively). It can also be provided that prior to applying a coating, a replication step, in particular an embossing step, is applied, so as to form material on substrate P on which the coating shall be present, cf. also FIGS. 8 and 9 and the corresponding description thereof.

Light entering module 1 (through transparent portion t) can propagate along a light path passing, in this order, grating 36, mirrors 31, 31', 31'', 31''', 31'''' and detector arrangement 26. Several spacer portions, namely Sb, Sb', Sb'', Sb''', Sb'''', block stray light from propagating towards detecting arrangement 26. In a first way of interpreting FIG. 6, the optical components shown in FIG. 6 are arranged substantially along one common x-z-plane. In this case, the optical module 1 shown in FIG. 6 will usually be of rather elongated shape, its extension in the y direction making up for only a fraction of its extension in the x direction (cf. the symbolic coordinate system in the bottom left corner of FIG. 6). The light path described by light propagating inside optical module 1 substantially runs along the x direction.

Figure 7:
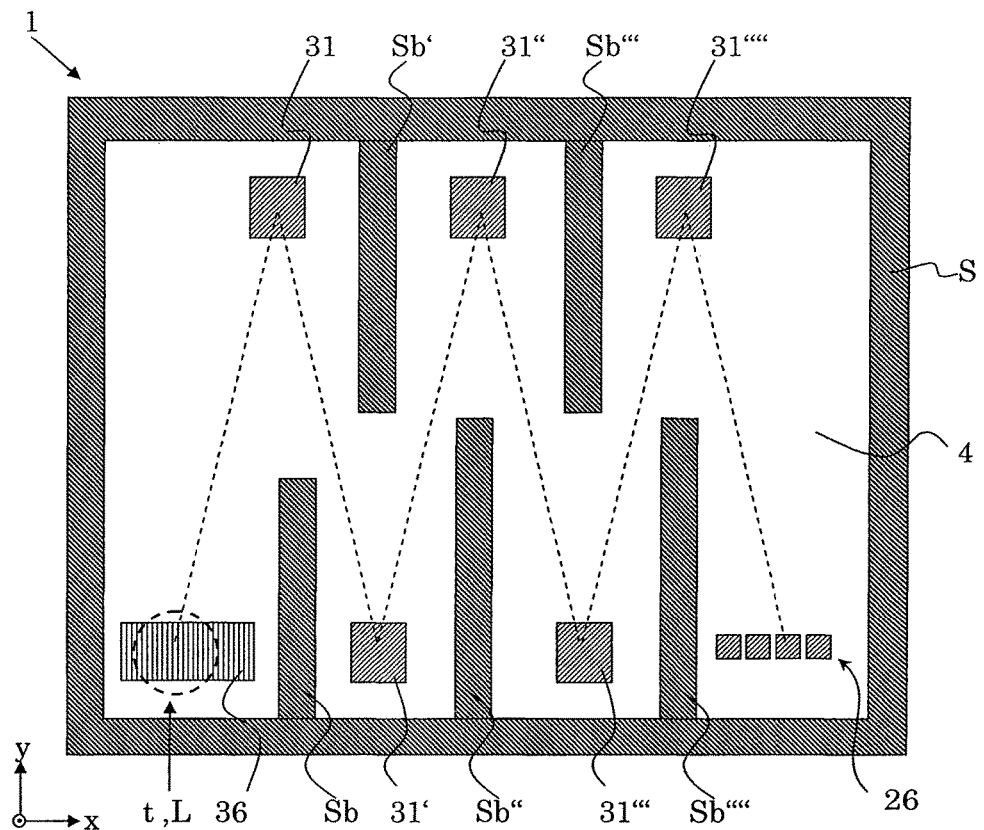
FIG. 7 a view onto a vertical cross-section through the embodiment of FIG. 6 in a particular interpretation.

It is, however, also possible to make specific use also of the y direction, as is exemplarily shown in FIG. 7. FIG. 7 shows a view onto a vertical cross-section through the embodiment of FIG. 6 in a second interpretation. The dotted line and the open arrow in FIG. 6 indicate where approximately said cross-section is taken. In this particular interpretation of the embodiment illustrated in FIG. 6, the light path described by light propagating inside optical module 1 has substantial components in both, the x direction and the y-direction. This way, rather long path lengths of the light path along which light propagates inside optical module 1 can be achieved. And various ways of shaping a light beam inside optical module 1 can thus be realized, at least partially due to the mirror elements in the module.

As is illustrated, too, in FIG. 7, it is also possible to choose virtually any suitable extensions of the spacer portions Sb, Sb', Sb'', . . . along the y-axis. But with the vertical extension like shown in FIG. 6, the extension along the y-axis of the spacer portions Sb, Sb', Sb'', . . . could also fully traverse the extension along the y-axis of opening 4 (unlike shown in FIG. 7). And, vice versa, provided an extension along the y-axis of the spacer portions Sb, Sb', Sb'', . . . as illustrated in FIG. 7, the extension along the z-axis of the spacer portions Sb, Sb', Sb'', . . . could also fully traverse the vertical extension along the z-axis of opening 4 (unlike shown in FIG. 6). Of course, in general, and for any embodiment, not only rectangular shapes are possible for spacer portions such as spacer portions Sb, Sb', Sb'', . . . , but many more, such as, e.g., wedge shapes and angled shapes.

Also the mirror elements may be plane or curved and of rectangular or round or any other shape.

Figure 11:
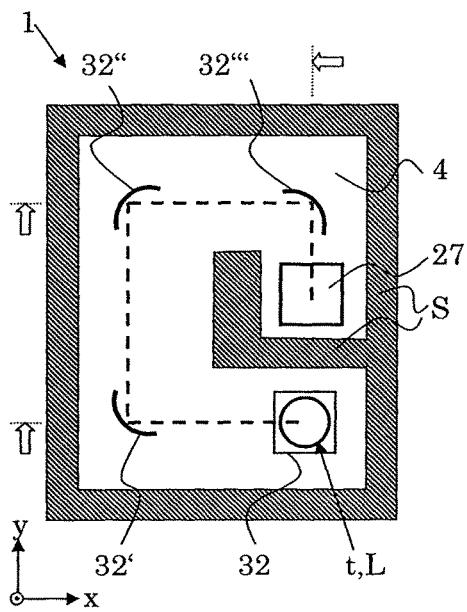
FIG. 11 an illustration of a lateral view of an optical module.
Figure 14:
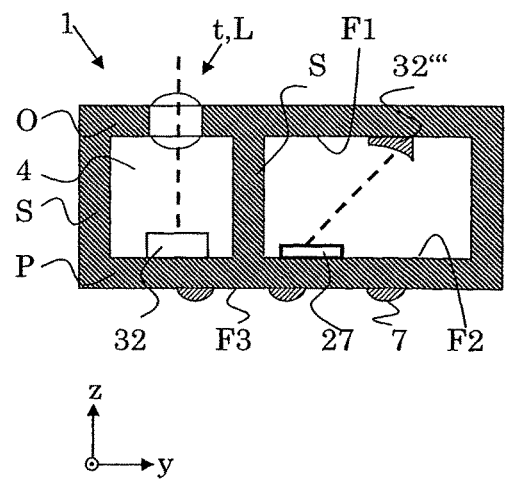
FIG. 14 an illustration of a vertical cross-section through the optical module of FIG. 11.
Figure 12:
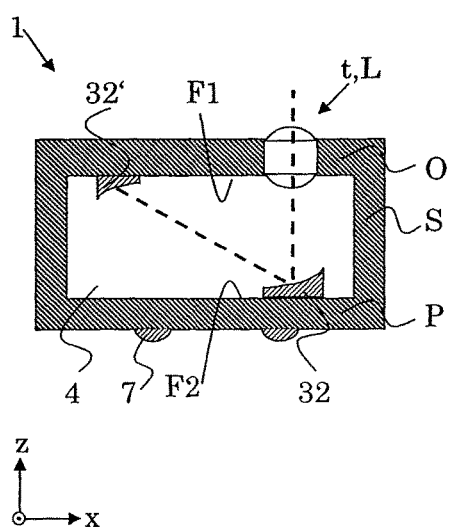
FIG. 12 an illustration of a vertical cross-section through the optical module of FIG. 11.
Figure 13:
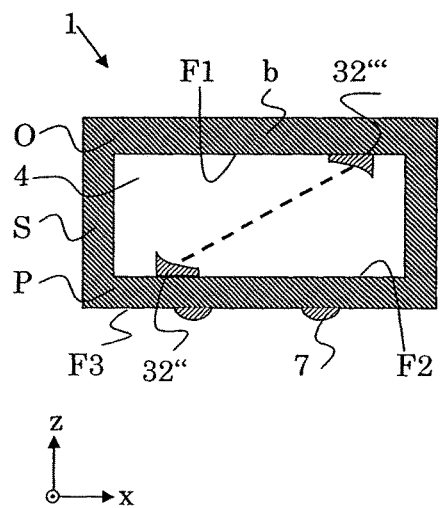
FIG. 13 an illustration of a vertical cross-section through the optical module of FIG. 11.

FIGS. 11 to 14 illustrate another example for the possibility to make use of more than one lateral direction in an optical module and to use mirror elements for accomplishing this. FIG. 11 is an illustration of a lateral view of a corresponding optical module 1, FIGS. 12 to 14 are illustrations of different vertical cross-sections through optical module 1 of FIG. 11. The locations where the cross-sections are taken, are indicated in FIG. 11 by the dotted lines and open arrows.

Light enters optical module 1 of FIGS. 11 to 14 through transparent portion t and is then subsequently reflected by four passive optical components, more particularly by mirror elements 32, 32', 32'', 32''' (optical mirrors). One or more of the mirror elements, e.g., (like illustrated in the Figures) all of the mirror elements, may be curved mirrors. An elaborate imaging and/or beam shaping may thus be achieved. The light impinges on active optical component 27, more particularly on a light detector, e.g., on an image detector. This optical module 1 may thus constitute, e.g., a photographic device.

It is to be noted that separation member S is particularly shaped in this embodiment. A portion thereof can be considered a light shield which keeps unwanted light from impinging on active optical component 27. Thus, this portion has a function at least similar to that of spacer portions Sb, Sb', . . . in, e.g., FIGS. 6 and 7. This portion can, as visible in FIG. 14, extend from a face F1 of optics member O to a face F2 of substrate member S.

Note that in FIGS. 12, 13 and 14, the members O, S and P are not clearly distinguished in the drawing. As has been explained and illustrated before, it is possible to provide that optics member O and separation member S or substrate member P and separation member S are unitary parts. And it is of course also possible to provide that they are distinct parts, e.g., as drawn in other Figures, e.g., FIGS. 1 to 6. It is, in general, possible to provide for any of a separate separation member S; or
a separation member S comprised in optics member O; or
a separation member S comprised in substrate member S;
in any described embodiment.

FIG. 15 is a cross-sectional view of a device 10 comprising an optical module 1. In many aspects, this optical module 1 is similar to the one of FIG. 1, cf. also the respective reference numerals. But the optical module 1 of FIG. 15 comprises two separate channels: one emission channel (on the right-hand side of FIG. 15) and one detection channel (on the left-hand side of FIG. 15). A spacer portion Sp of spacer member S optically separates the two channels; it can thus be referred to as a channel separator Sp. Thus there is no cross-talk between the channels (provided channel separator Sp is non-transparent). Separation member S comprises two separate openings 4 and 4', respectively, one for each channel. The emission channel comprises an emission member 22 as an active optical component, e.g., an LED or laser diode. The detection channel comprises, as an active optical component, an arrangement 26 of detecting members, such as photo diodes, wherein a multi-pixel detector could be provided, too. The detection channel furthermore comprises passive optical components, more particularly a diffraction grating 36 and an optical mirror 31. And a spacer portion Sb functioning as a light shield is provided in the detection channel, similar to the spacer portions Sb in FIGS. 5 and 6.

Light emitted by emission member 22 traverses transparent portion t comprising lens member L, usually for beam forming. If the light thus emitted from optical module 1 then interacts with an external object, a portion thereof can finally enter optical module 1, more particularly the detection channel, namely via transparent portion t' comprising lens member L'. That light is then reflected by mirror element 31 and subsequently diffracted by diffraction grating 36 and, at least in part, may impinge on one or more of the detecting members of the arrangement 26. For light diffracted at diffraction grating 36, the direction of propagation depends on the wavelength of the light.

The amount of so-detected light and its distribution over the detecting members may allow to draw conclusions with respect to color and/or position of external objects, wherein this position refers to a relative position of the external object with respect to optical module 1. Such an optical module 1 can be, e.g., a proximity sensor and/or a (simple) spectrometer (having its own light source).

Figure 10:
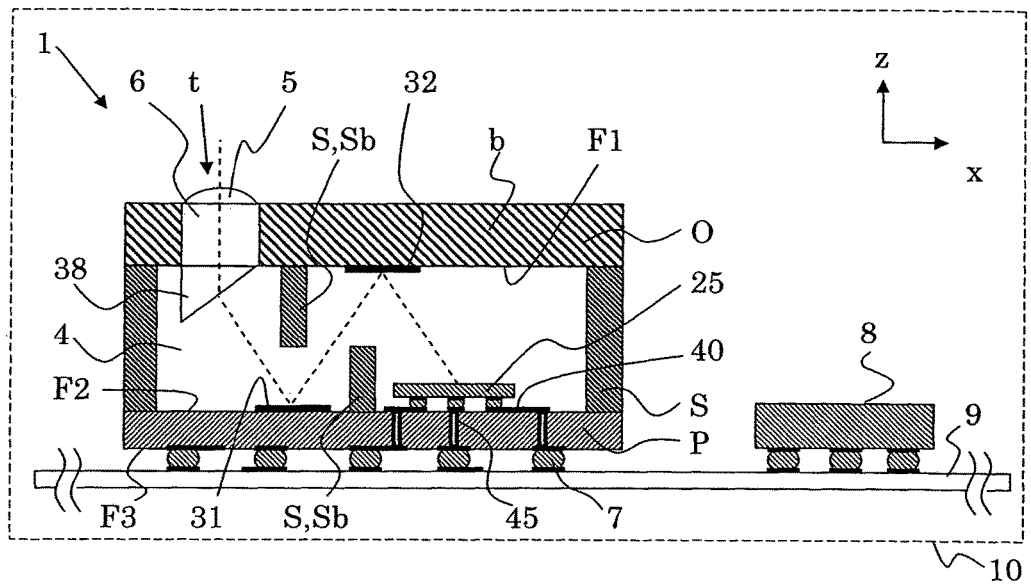
FIG. 10 a cross-sectional view of a device comprising an opto-electronic module.

FIG. 10 is a cross-sectional view of a device 10 comprising an opto-electronic module 1. In FIG. 10, the electrical connections, in particular those provided by substrate P, are illustrated in more detail than in other Figures, where, nevertheless, similar electrical contacts may be present. The module 1 of FIG. 10 comprises an optics member O, a separation member S and, embodied as a printed circuit board or printed circuit board assembly, a substrate member P. Transparent portion t comprises a lens element 5 and a prism 38 and between these a transparent element 6. On face F1 of optics member O, a mirror element 32 is provided. Another mirror element 31 as well as an active optical component, more specifically a detection member 25 such as an image detector, is present at face F2 of substrate member P. Mirror element 31 may be, e.g., created on face F2 in similar processing steps as used for producing conductive tracks and conductive areas 40 on face F2 or even in the same (identical) processing steps. But generally, mirror element 31 may also be produced in other processing steps than used for producing conductive tracks and conductive areas 40 on face F2. Vias 45 such as plated through-holes create electrical connections interconnecting faces F2 and F3. Thus, a redistribution of electrical contacts from active optical component 25 to printed circuit board 9 is accomplished.

Light entering module 1 of FIG. 10 through transparent portion t is redirected by prism 38. At least a portion thereof is reflected by mirror element 31, and least a portion of the reflected light is then reflected by mirror element 32, and finally, light impinging on detection member 25 is detected there. If prism 38 merely redirects light, usually due to having little dispersion, module 1 may, e.g., be an imaging apparatus. But if prism 38 provides a high dispersion and redirects light in dependence of the light wavelength, module 1 may be a spectrometer or spectrometer module.

As is clear from the above, many kinds of optical arrangements can be realized within the framework of the invention, e.g., various arrangements which in general would be particularly suitable for realization using slab optics. But also standard optical setups can be realized in a miniaturized and mass-producible way, wherein passive as well as active optical modules can be provided. Mirror elements may make possible to realized complicated light paths in the module, and if they are present on a PCB-like member of the module, that member can, fulfill a plurality of functions. And particular ways of manufacturing mirror elements, as described above, in particular on a PCB-like member, can provide an excellent mass-producibility in high quality.

By means of the invention, various optical arrangements can be realized in a miniscule optical package (module 1).

The invention claimed is:

1. An optical module comprising
   a first member having a first face which is substantially planar;
   a second member having a second face facing said first face, which is substantially planar and is aligned substantially parallel to said first face;
   a third member comprised in said first member or comprised in said second member or distinct from and located between these, which comprises an opening;
   a mirror element present on said second face; and an active optical component present on said second face and electrically connected to said second member;

wherein at least one of said first or second members comprises one or more transparent portions through which light can pass, wherein the optical module is arranged such that, when light is produced by the active optical component or when light is received through at least one of said transparent portions, the light propagates along a light path interconnecting said mirror element and said active optical component and at least one of said transparent portions.

2. The module according to claim 1, wherein said second member comprises a printed circuit board or a printed circuit board assembly.

3. The module according to claim 1, wherein said mirror element is at least substantially made of a hardened hardenable material.

4. The module according to claim 1, wherein said mirror element is a replicated mirror element.

5. The module according to claim 1, wherein by said second member, at least one electrical connection across the second member is provided.

6. The module according to claim 1, wherein said mirror element comprises a bulk optical element bonded to said second member.

7. The module according to claim 1, wherein said mirror element comprises a coating applied to said second face.

8. The module according to claim 1, wherein said second member comprises:
a third face aligned substantially parallel to said second face;
an electrically insulating base material between said second and said third face; and
at each of said second face and said third face, one or more electrically conductive tracks and/or one or more electrically conductive contact areas.

9. The module according to claim 1, wherein said opening is delimited by said first, second and third members.

10. The module according to claim 1, wherein said first, second and third members are of generally block-shaped or plate-shaped, and each of said first, second and third members comprising at least one hole or being devoid of a hole.

11. The module according to claim 1, wherein outer bounds of a vertical silhouette of the module and outer bounds of a vertical silhouette of said first, second and third members each describe a substantially rectangular shape, wherein vertical directions are perpendicular to the first face.

12. The module according to claim 1, wherein at least one of said first and second member is, at least in part, made substantially of an at least substantially non-transparent material.

13. The module according to claim 1, wherein said third member is a unitary part.

14. The module according to claim 1, comprising an inside volume and a housing enclosing said inside volume, said inside volume being comprised in said opening, said housing being, except for said one or more transparent portions, completely non-transparent, such that light can enter or exit said inside volume solely through said one or more transparent portions, wherein said first, second and third members contribute to said housing.

15. The module according to claim 1, wherein a maximum vertical extension of the module is at most 25 mm, and a maximum lateral extension of the module is at most 30 mm, wherein vertical directions are perpendicular to the first face.

16. An appliance comprising a multitude of optical modules according to claim 1 and comprising
a first wafer comprising a multitude of said first members;
a second wafer comprising a multitude of said second members;
a third wafer comprising a multitude of said third members, wherein said third wafer is comprised in said first wafer or is comprised in said second wafer or is distinct from these;
a multitude of said mirror elements; and
a multitude of said active optical components.

17. An optical module comprising
a first member having a first face which is substantially planar;
a second member having a second face facing said first face, which is substantially planar and is aligned substantially parallel to said first face;
at least one electrical connection extending through the second member;
a third member comprised in said first member or comprised in said second member or distinct from and located between these, which comprises an opening;
a mirror element present on said second face; and
an active optical component present on said second face and electrically connected to said second member;
wherein at least one of said first or second members comprises one or more transparent portions through which light can pass,
the optical module being arranged such that, when light is produced by the active optical component or when light is received through at least one of said transparent portions, the light propagates along a light path interconnecting the mirror element and the active optical component and at least one of the transparent portions, and
wherein at least one of the following (i) or (ii) applies:
(i) the second member comprises a printed circuit board or a printed circuit board assembly;
(ii) the second member comprises:
a third face aligned substantially parallel to said second face;
an electrically insulating base material between said second and said third face; and
at each of the second face and the third face, one or more electrically conductive tracks and/or one or more electrically conductive contact areas.

* * * * *